United States Patent
Joe

(10) Patent No.: US 7,387,968 B2
(45) Date of Patent: Jun. 17, 2008

(54) BATCH PHOTORESIST DRY STRIP AND ASH SYSTEM AND PROCESS

(75) Inventor: Raymond Joe, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 7 days.

(21) Appl. No.: 11/269,007

(22) Filed: Nov. 8, 2005

(65) Prior Publication Data

US 2007/0105392 A1 May 10, 2007

(51) Int. Cl.
*H01L 21/302* (2006.01)

(52) U.S. Cl. .................. 438/716; 438/706; 438/710; 134/1.2

(58) Field of Classification Search ........... 438/706, 438/710, 712, 714, 71, 6; 134/1.1, 1.2; 156/345.33, 156/55
See application file for complete search history.

(56) References Cited

U.S. PATENT DOCUMENTS

| | | | | |
|---|---|---|---|---|
| 4,812,201 A * | 3/1989 | Sakai et al. | ............... | 438/725 |
| 5,217,560 A | 6/1993 | Kurona et al. | | |
| 5,284,547 A * | 2/1994 | Watanabe | ............... | 216/59 |
| 5,773,201 A * | 6/1998 | Fujimura et al. | ............... | 430/329 |
| 6,281,135 B1 | 8/2001 | Han et al. | | |
| 6,630,406 B2 | 10/2003 | Waldfried et al. | | |
| 6,638,875 B2 | 10/2003 | Han et al. | | |
| 6,693,043 B1 | 2/2004 | Li et al. | | |
| 6,834,656 B2 | 12/2004 | Qingyuan et al. | | |
| 2003/0045131 A1* | 3/2003 | Verbeke et al. | ............... | 438/795 |
| 2003/0164143 A1 | 9/2003 | Toyoda et al. | | |
| 2003/0186517 A1 | 10/2003 | Takagi | | |

FOREIGN PATENT DOCUMENTS

WO 99/39382 A1 8/1999

OTHER PUBLICATIONS

EPO, International Search Report and Written Opinion of the International Searching Authority, International Application No. PCT/US2006/043350, Mailed on May. 9, 2007 (12 pages).

* cited by examiner

*Primary Examiner*—Lan Vinh
(74) *Attorney, Agent, or Firm*—Wood, Herron & Evans, L.L.P.

(57) ABSTRACT

Photoresist stripping is provided that employs batch processing to maximize throughput and an upstream plasma activation source using vapor or gas processing to efficiently create reactive species and minimize chemical consumption. An upstream plasma activation source efficiently creates reactive species remote from the photoresist on the substrate surfaces. Either a remote plasma generator upstream of the processing chamber or an integrated plasma unit within the processing chamber upstream of the processing volume may be used. Plasma processing gas is introduced from a side of a stack of wafers and flows across the wafers. Processing gas may be forced across the surfaces of the wafers in the column to an exhaust on the opposite side of the column, and the column may be rotated. An upstream plasma activation source enables a strip process to occur at low temperatures, for example below 600 degrees C., which are particularly advantageous in BEOL process flow. Integrated processes that combine dry and wet-like sequential processes are also provided. Oxidizing, reducing or fluorine-containing plasma can be employed. Wet stripping, using, for example, wafer vapor or ozone or both may be included, simultaneously or sequentially.

10 Claims, 5 Drawing Sheets

US 7,387,968 B2

BATCH PHOTORESIST DRY STRIP AND ASH SYSTEM AND PROCESS

This invention relates to the removal of photoresist in semiconductor wafer processing.

BACKGROUND OF THE INVENTION

Part of semiconductor manufacturing includes the patterning of structures onto silicon wafers. The patterning is carried out by depositing a layer of photoresist material, then exposing a pattern onto the photoresist layer to selectively and lithographically alter the properties of the layer, then etching the exposed photoresist layer to selectively remove an underlying material in accordance with the exposed pattern, then removing the remaining photoresist.

Photoresist removal has been carried out by either batch wet-processing or single-wafer plasma dry processing. Batch wet-processing is commonly found in front-end on-line systems (FEOL) while single-wafer dry processing is commonly found in back-end on-line systems (BEOL). Initially, batch wet-stripping was used for resist removal, but processing costs were high and processing requirements were not satisfactorily met. Batch barrel plasma ashers were then tried, but wafer damage resulted. This led to the use of remote-plasma single-wafer dry systems. Companies providing the current dry stripping systems include Mattson, Novellus, Applied Materials and Axcelis. Patents describing some of these systems include U.S. Pat. Nos. 6,693,043, 6,638,875, 6,281,135, 6,630,406 and 6,834,656.

Wet strip systems today still provide low throughput, high chemical consumption cost and high equipment cost and require an excessive oxidizing environment. Dry plasma strip systems still suffer from plasma damage to the wafer.

Accordingly, there is a need for photoresist stripping that overcomes problems with the prior art.

SUMMARY OF THE INVENTION

In accordance with principles of the present invention, photoresist stripping is provided that employs batch processing to maximize throughput and an upstream plasma activation source using vapor or gas processing to efficiently create reactive species and minimize chemical consumption.

In accordance with the described embodiments of the present invention, a plasma activation source is provided upstream of the substrates to be processed to efficiently create reactive species remote from the photoresist on the substrate surfaces. In particular, a batch photoresist dry strip and ash system and method applies a plasma generated either by a remote plasma generator upstream of the processing chamber or by an integrated plasma unit within the processing chamber upstream of the processing volume in which are situated the substrates to be processed.

In accordance with illustrated embodiments of the invention, plasma processing gas is introduced from a side of the wafers and caused to flow across the wafers. In certain embodiments, a plurality of wafers are stacked in a column in a vacuum processing chamber with the plasma generated or introduced along one side of the column and forced to flow across the surfaces of the wafers in the column to an exhaust on the opposite side of the column. The wafers are stacked in the column and may be rotated on a common axis as the processing gas flows across the wafers.

In certain embodiments, the use of an upstream plasma activation source enables a strip process to occur at low temperatures, for example below 600 degrees C., which are particularly advantageous in BEOL process flow.

Embodiments of the present invention combine batch photoresist-strip processing, plasma generation of reactive species remote from the wafers, and cross-flow of the reactive species across the wafers. With certain embodiments, integrated processes that combine dry and wet-like sequential processes are also provided. The integrated processes can include thermal processes, and can utilize wet-like strip processes using, for example, wafer vapor and ozone.

The use of remote plasma activation allows the advantages of single wafer plasma dry strip processes to be applied to a batch processing system in addition to reducing wafer damage.

Various embodiments of the process of the invention include providing oxidizing, reducing or fluorine-containing plasma environment, and providing damage minimization to advanced materials such as low-k films and copper.

The invention provides the advantages that a conventional single-wafer dry-strip system provides over wet-strip systems, such as reduced chemical consumption and reduced chemical disposal as well as providing less damage to underlying advanced materials such as low-k film and copper. At the same time, the invention provides the advantages of wet-strip processes over dry-strip processes, such as the ability for water vapor and ozone processing to be used in a non-plasma environment in the same system.

Embodiments of the invention may use a hot wall process chamber, which can mitigate residue buildup and effectively increase system uptime.

Systems according to the present invention can utilize a smaller footprint apparatus than certain prior art strip systems.

These and other objects and advantages of the present invention will be more readily apparent from the following detailed description of illustrated embodiments of the invention.

DETAILED DESCRIPTION OF THE DRAWINGS

Figure 1:
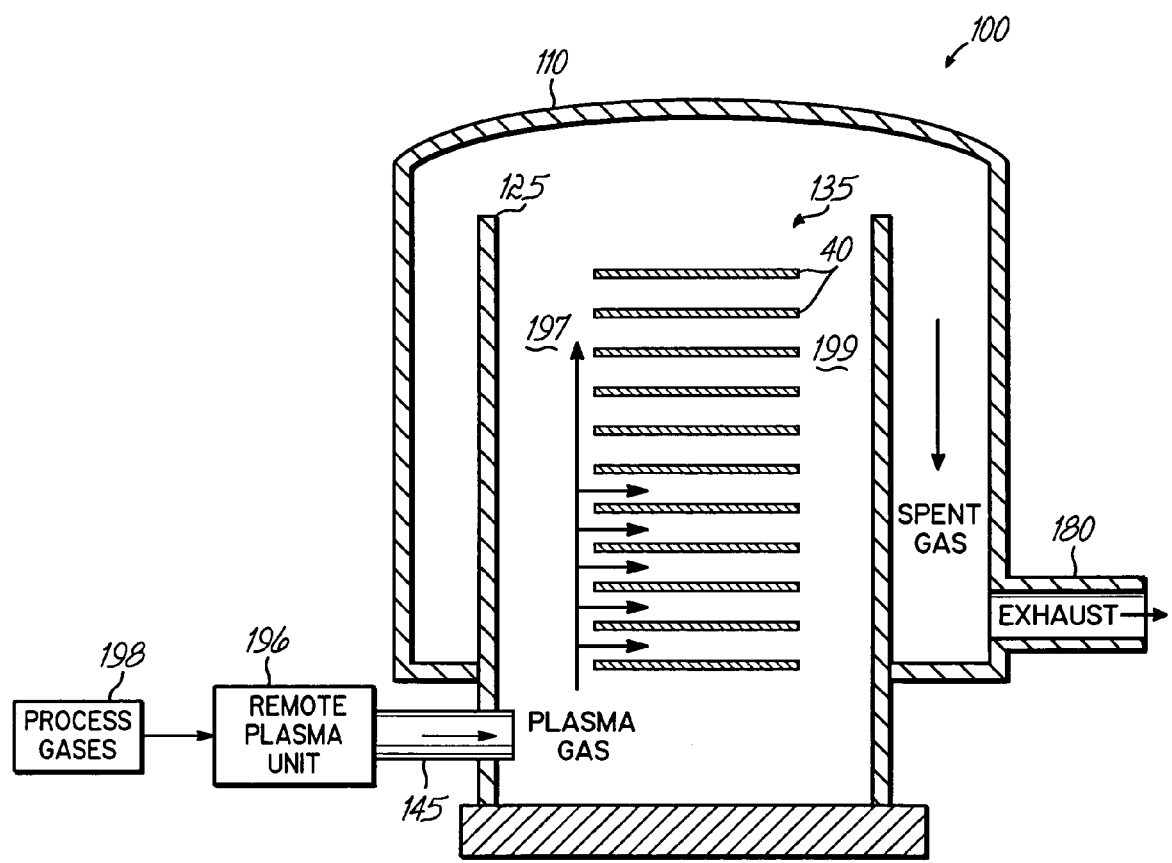
FIG. 1 is a diagram of one embodiment of a batch photoresist dry strip and ash system according to principles of the present invention.

FIG. 1 illustrates one embodiment of a photo-resist stripping processing apparatus 100 according to principles of the present invention. The apparatus 100 is a batch processing apparatus that includes a process chamber 110 that contains a process tube 125. The chamber 110 has an exhaust port 180 connected to a vacuum pumping system (not shown) that is configured to maintain a pre-determined atmospheric or below atmospheric pressure in the processing chamber 110.

A substrate holder is in the form of a column 135 contained in the tube 125 and configured to hold a plurality of semiconductor wafer substrates 40 in a vertical stack.

A gas source 198 is provided to supply a plurality of gases into the process tube 25 through the gas supply lines. The gas source 198 is connected to a remote plasma generating unit 196 which forms a plasma in the process gas and delivers the gas to a gas supply line 145 through which the plasma gas is introduced into the chamber 110.

In the apparatus 100, plasma containing gas is introduced into the chamber 110 through inlet line 145 from which it flows along one side 197 of the tube 125. From the one side 197 of the tube 125, the plasma gas flows across the surfaces of the wafers 40 supported on the column 135 to an opposite side 199 of the tube 125, from which it flows through the outlet 180 out of the chamber 110.

Figure 2:
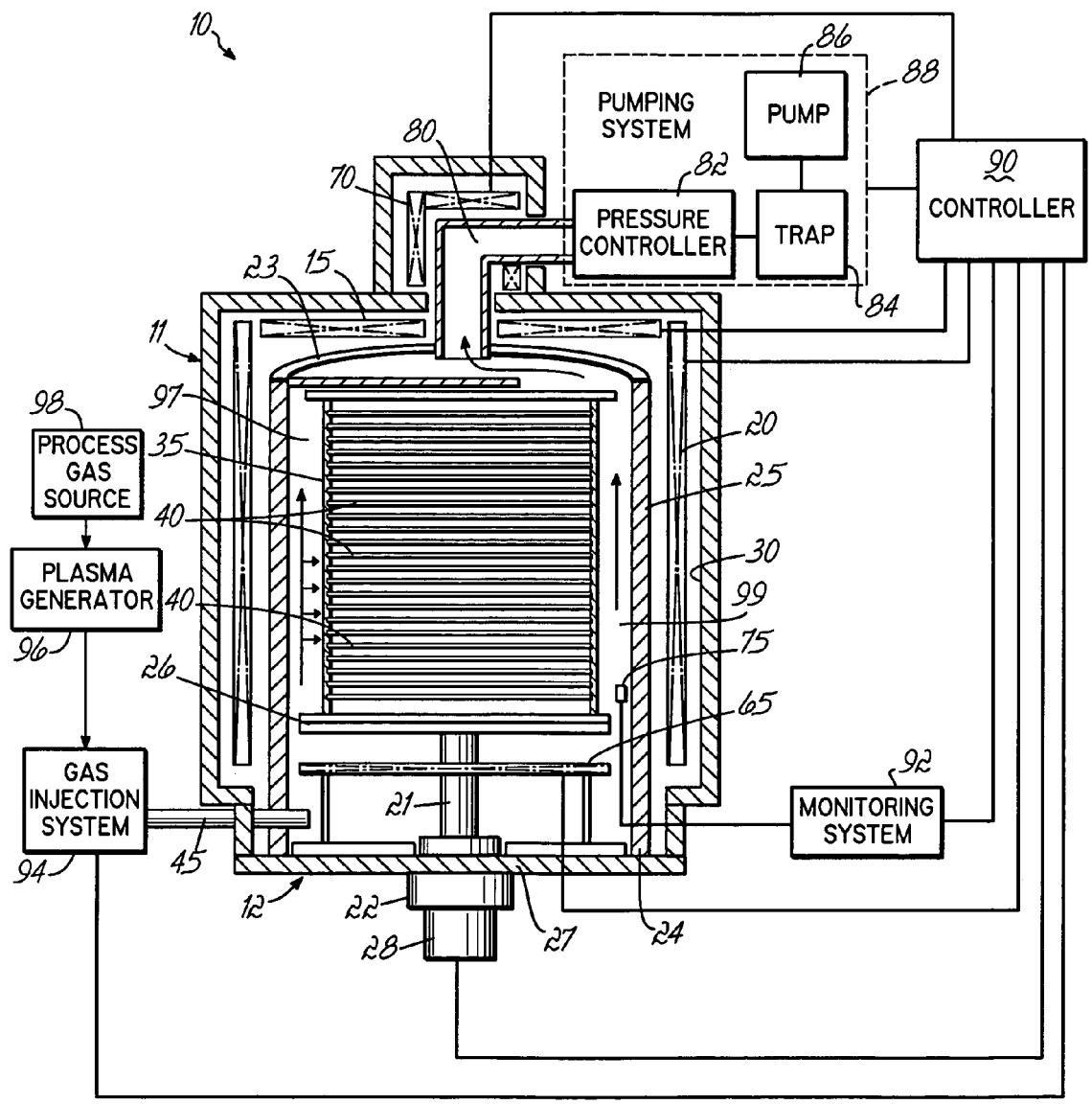
FIG. 2 is a diagram similar to FIG. 1 of another embodiment of a batch photoresist dry strip and ash system according to principles of the present invention.

Another embodiment of a processing apparatus 10 according to the present invention is illustrated in the simplified block diagram of FIG. 2. The apparatus 10 is a batch processing apparatus that includes a process chamber 11 and a process tube 25 that has an upper end connected to an exhaust pipe 80 and a lower end hermetically joined to a lid 27 of a cylindrical manifold 12. The exhaust pipe 80 discharges gases from the process tube 25 to a vacuum pumping system 88 to maintain a pre-determined atmospheric or below atmospheric pressure in the processing system 10. A substrate holder is in the form of a column 35 and is configured for holding a plurality of semiconductor wafer substrates 40 in a vertical stack, in respective horizontal planes at vertical intervals, in the process tube 25. The substrate holder 35 resides on a turntable 26 that is mounted on a rotating shaft 21 penetrating the lid 27 and driven by a motor 28. The turntable 26 can be rotated during processing or, alternately, can be stationary during processing. The lid 27 is mounted on an elevator 22 for transferring the substrate holder 35 in and out of the process tube 25. When the lid 27 is positioned at its uppermost position, the lid 27 is adapted to close the open end of the manifold 12.

A plurality of gas supply lines can be arranged around the manifold 12 to supply a plurality of gases into the process tube 25 through the gas supply lines. In FIG. 2, only one gas supply line 45 among the plurality of gas supply lines is shown. The gas supply line 45 is connected to a gas injection system 94. A cylindrical heat reflector 30 is disposed so as to cover the reaction tube 25. The heat reflector 30 has a mirror-finished inner surface to suppress dissipation of radiation heat radiated by main heater 20, bottom heater 65, top heater 15, and exhaust pipe heater 70. A helical cooling water passage (not shown) is formed in the wall of the process chamber 10 as a cooling medium passage.

A vacuum pumping system 88 comprises a vacuum pump 86, a trap 84, and automatic pressure controller 82. The vacuum pump 86 can, for example, include a dry vacuum pump capable of a pumping speed up to at least 20,000 liters per second. During processing, gases can be introduced into the process chamber 10 via the gas injection system 94 and the process pressure can be adjusted by the automatic pressure controller 82. The trap 84 can collect unreacted precursor material and by-products from the process chamber 11.

The process monitoring system 92 comprises a sensor 75 capable of real-time process monitoring. A controller 90 includes a microprocessor, a memory, and a digital I/O port capable of generating control voltages sufficient to communicate and activate inputs to the processing system 10 as well as monitor outputs from the processing system 10. Moreover, the controller 90 is coupled to and can exchange information with gas injection system 94, motor 28, process monitoring system 92, heaters 20, 15, 65, and 70, and vacuum pumping system 88.

Coupled to an inlet of the gas injection system 94 is a plasma generator 96, which has an inlet to which is coupled a process gas source 98. Gas from the process gas source 98 is injected into the plasma generator 96 which forms a plasma in the process gas. This plasma containing gas is introduced into the gas injection system 94, which injects the gas into the chamber 11 along one side 97 of the column 35, from which the plasma containing gas flows across the surfaces of wafers 40 supported on the column 35 to the opposite side 99 of the column 35, from which it is exhausted through the exhaust pipe 80.

Figure 3:
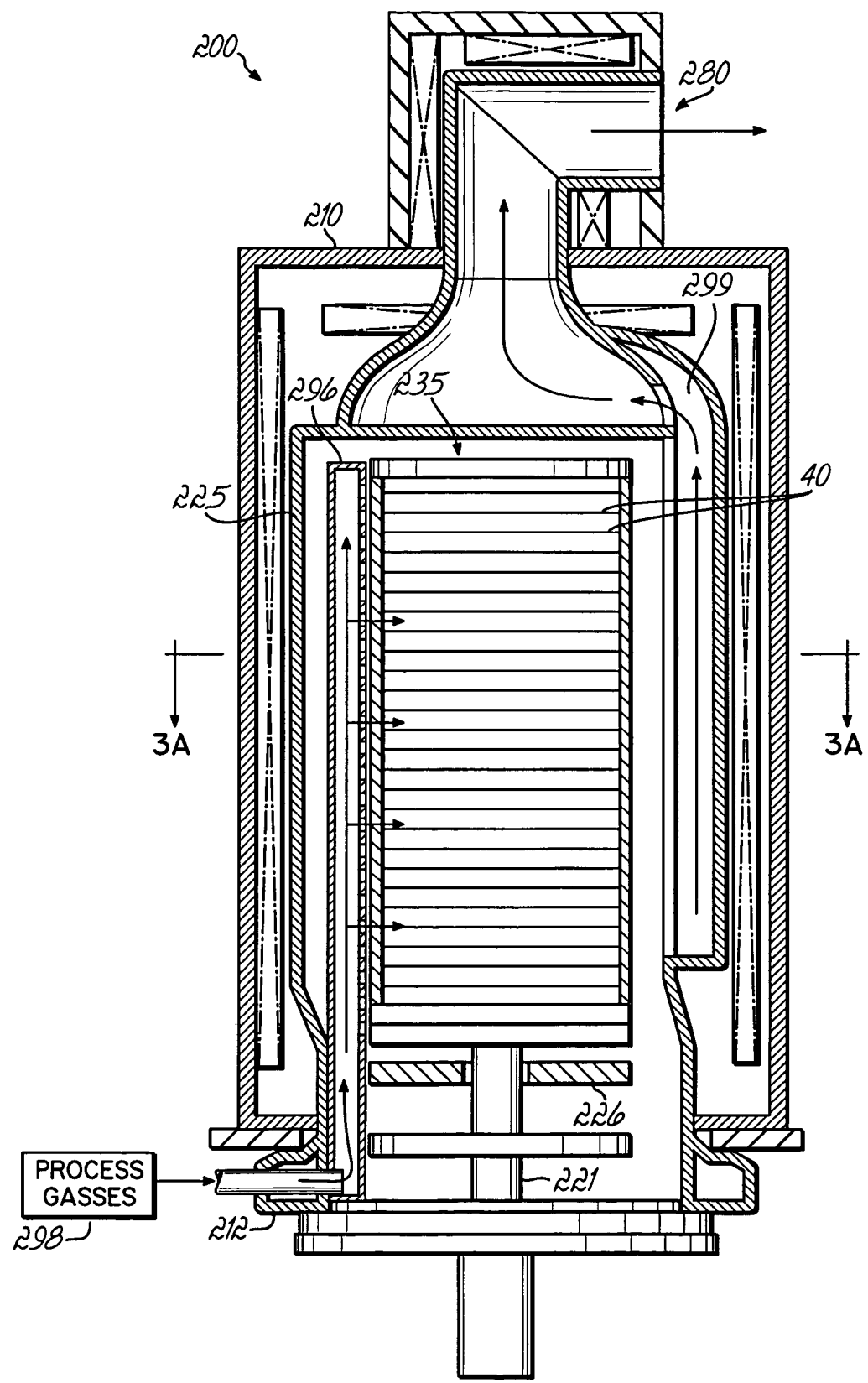
FIG. 3 is another diagram similar to FIGS. 1 and 2 of still another embodiment of a batch photoresist dry strip and ash system according to principles of the present invention.
Figure 3A:
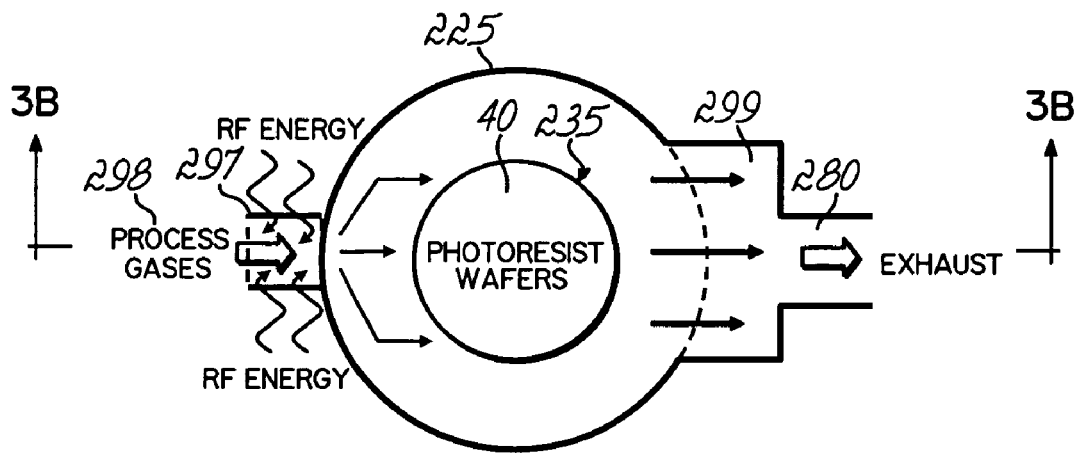
FIG. 3A is a cross-sectional plan diagram of the embodiment of FIG. 3.
Figure 3B:
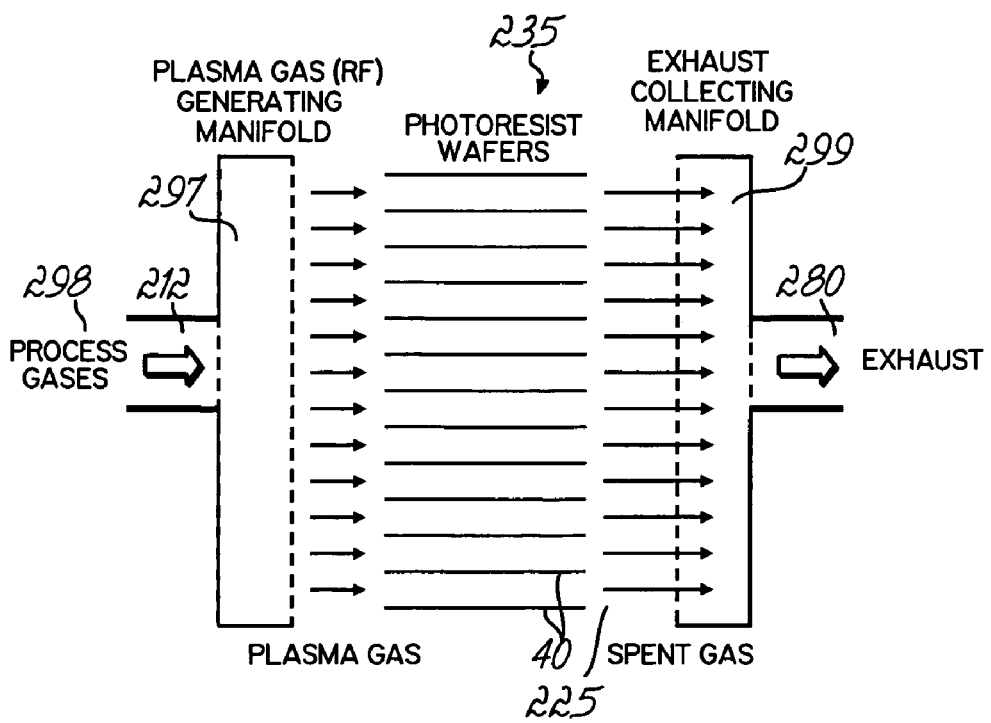
FIG. 3B is a cross-sectional elevational diagram of the embodiment of FIG. 3.

FIGS. 3, 3A and 3B illustrate another embodiment of the invention in which a processing apparatus 200 is provided with in integrated plasma generator in the form of a plasma generating manifold 296, where a plasma is produced in an injected gas, for example, by coupling RF energy thereto. The apparatus 200 includes a processing chamber 210 having a process tube 225 therein. An exhaust pipe 280 is connected to the chamber 210 to discharge gases from the process tube 225 from along one side 299 of the process tube 225 to a vacuum pumping system (not shown). A substrate holder is provided in the form of a column 235 that is configured to hold a plurality of semiconductor wafer substrates 40 in a vertical stack. The substrate holder 235 resides on a turntable 226 that is mounted on a rotating shaft 221 driven by a motor (not shown). The turntable 226 can be rotated for rotating the wafers 40 thereon during processing.

One or more gas supply sources can be connected to an inlet manifold 212 to supply one or more gases into a plasma gas generating manifold 296 along one side 297 of the process tube 225, from which side the plasma process gas can flow across the surfaces of wafers 40 on the column 235 while the wafers 40 are being rotated on the column 235 by the rotating turntable 226. The gas flows across the wafers 40 removing the photo-resist therefrom, then flows to the exhaust collecting manifold 299 on the opposite side of the tube 225 from the plasma generating manifold 297. From the exhaust manifold 299 the gases and removed photo-resist are removed from the chamber 210 via the exhaust 280.

With the systems 10, 100 and 200 described above, process gas to be input into the plasma unit can include, but is not necessarily limited to, the following examples: For certain applications including certain photoresist removal applications, an oxidizing environment may be best suited to remove the photoresist. In these situations, to create the oxidizing environment, process gases such as $O_2$, $O_2$ and inert gas, NO, NO and inert gas, $N_2O$, or $N_2O$ and inert gas are introduced into a plasma generating unit or manifold. The inert gas can be, but is not necessarily limited to, $N_2$, He or Ar. The oxidizing process gas can comprise 0.01 to 50% by volume of the total gas.

For certain other applications, including photoresist removal applications, a reducing environment may be best suited to remove the photoresist. For these situations, to create the reducing environment, process gases, such as $H_2$, $H_2$ and inert gas, $NH_3$, or $NH_3$, are introduced into the plasma generating unit or manifold. The inert gas can be, but is not necessarily limited to, $N_2$, He, or Ar. The reducing process gas can be 0.01 to 50% by volume of the total gas.

For certain other applications, including photoresist removal applications, a fluorine-containing environment might be best suited to remove the photoresist. For these situations, to create the fluorine-containing environment, process gases such as $F_2$, $F_2$ and inert gas, $NF_3$, $NF_3$ and inert gas, $CF_4$, or $CF_4$ and inert gas can be introduced into the plasma generating unit or manifold. The inert gas can be, but is not necessarily limited to, $N_2$, He, and Ar. The fluorine-containing process gas can be 0.01 to 50% by volume of the total gas.

For still other applications that may include photoresist removal, an oxidizing or reducing environment with a small amount of fluorine or fluorine-containing compounds may be best suited to remove the photoresist. For these situations, a fluorine-containing gas such as $F_2$, $F_2$ and inert gas, $NF_3$, $NF_3$ and inert gas, $CF_4$, or $CF_4$ and inert gas may be introduced into the plasma generating unit or manifold at a compositional percentage between 0.01% and 50% by volume. The remaining compositional volume may be made up of either an oxidizing or reducing gas as described above. The inert gas can be, but is not necessarily limited to, $N_2$, He, or Ar.

Total flows of such gases can range from 100 sccm to 50,000 sccm during the stripping process. Preferred gas flow range lies in the 1000 to 10,000 sccm range. Pressure can range from 50 milliTorr to 650 Torr range. Preferred pressure range lies in the 100 milliTorr to 10 Torr range. Temperature can range from 80C. to 900C. Preferred temperature range lies in the 100C. to 600C. range.

The plasma gas can be caused to flow across the substrates from one side to another from which it can be removed from the process chamber through an exhaust manifold. Prior art using multiple substrates relied on diffusion of the etching gases to reach the substrates. Herein, the reactive gas flows across the substrate surface by convection or convection and diffusion. At the same time, substrates can be rotating during the process.

Figure 4:
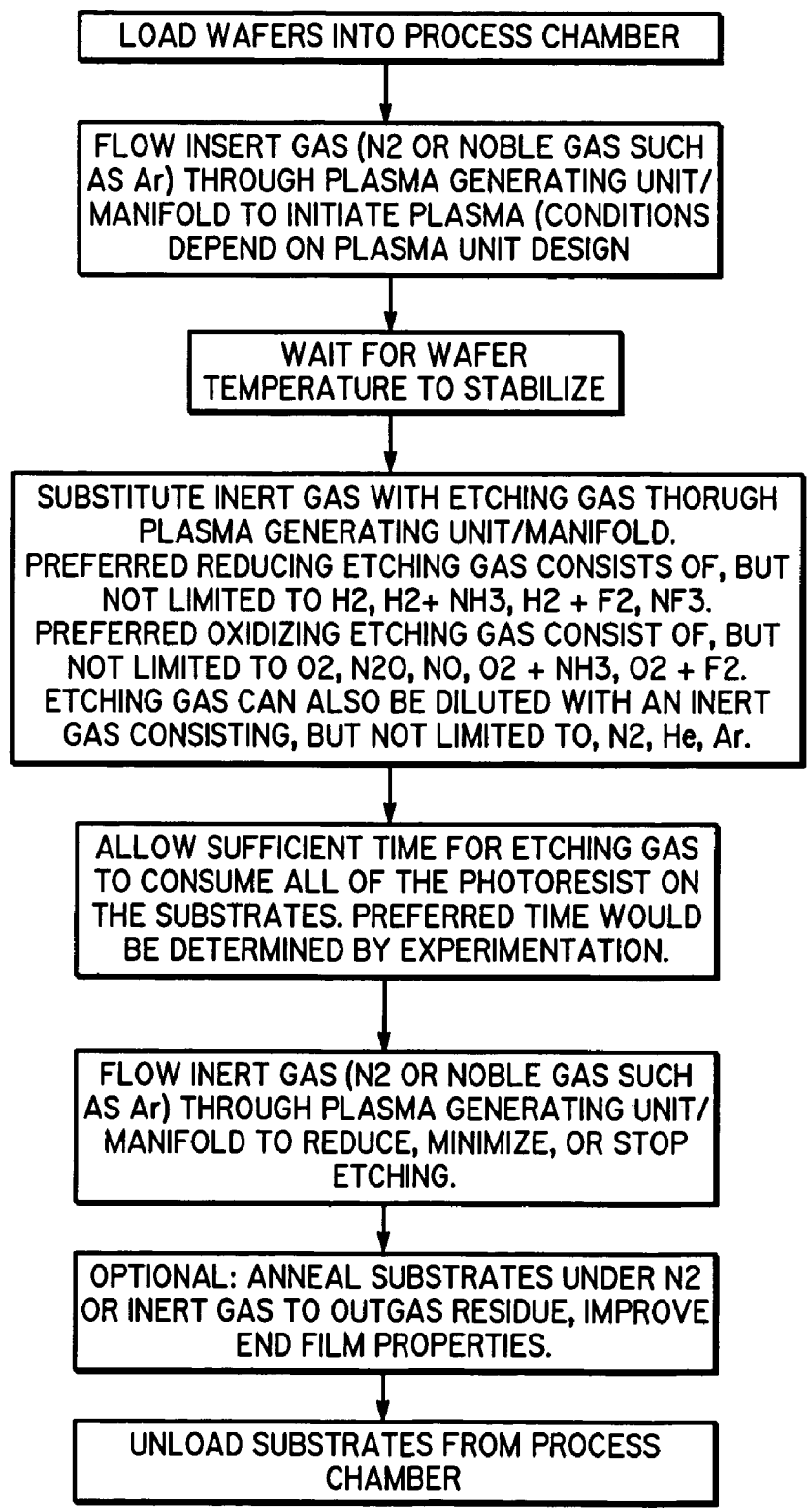
FIG. 4 is a flowchart of a batch photoresist dry strip and ash process according to principles of the present invention.

The processes described above may proceed in accordance with the steps set forth in the flow chart of FIG. 4.

For certain applications in which combination dry-plasma and wet-strip processes are determined to be best, high temperature water vapor, ozone, or a combination of water vapor and ozone, can assist in the removal of the photoresist. The water vapor or ozone process would be similar to a wet strip process, but in this case, the water would be in a vapor state rather than a liquid state. In this case, the water vapor or ozone or both may be generated by a third party vendor and can be equivalently substituted with radical oxygen generated by the plasma generating unit. The water vapor and ozone would then react on the substrate surface to remove photoresist. The process conditions (gas flow, temperature, pressure) would be similar to those set forth above. The water vapor or ozone may used in place of, in combination with, or in sequence with, the plasma alternatives described above.

In certain embodiments of the invention, sequential processing is enabled. For example, a photoresist can have a top layer of heavily carbonized nature while the bottom layer might be of a normal hydrogenated photoresist nature. Typically, semiconductor manufacturers would need to employ plasma resist stripping techniques on the upper layer in equipment suitable for that process and then use wet stripping techniques on the bottom layer in other equipment suitable for that process. With the present invention, one can employ a sequential dry-etch and wet-strip-like sequence, with water vapor and ozone or plasma stripping following a dry plasma environment stripping process to improve the removal of the resist.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method of removing photoresist from a semiconductor wafer comprising:
   supporting in a vertical stack in a process chamber a plurality of etched semiconductor wafers having a deposited and exposed photoresist layer thereon;
   introducing a reactive gas plasma onto the stack generally along only one side thereof while rotating the plurality of wafers about a vertical axis;
   flowing the introduced reactive gas plasma across the wafers from said one side of the stack, horizontally across each of the wafers of the rotating plurality to an opposite side of the stack that is diametrically opposite said one side of the stack, and
   removing the gas from the stack from said opposite side.

2. The method of claim 1 wherein:
   the flowing of the introduced reactive gas plasma includes forcing the flow of the reactive gas plasma across the wafers from said one side of the stack across each of the wafers to said opposite side at least in part by convection.

3. The method of claim 1 further comprising:
   introducing water vapor into the chamber from said one side and flowing the water vapor therefrom across the wafers and to said opposite side of the chamber.

4. The method of claim 1 further comprising:
   introducing ozone into the chamber from said one side and flowing water vapor therefrom across the wafers and to said opposite side of the chamber.

5. The method of claim 1 further comprising:
   subsequent to the introducing and flowing of at least some of the reactive gas plasma, introducing and flowing across the wafers from said one side of the stack and across each of the rotating plurality of wafers to said opposite side of the stack, a combination of water vapor and ozone.

6. The method of claim 1 wherein the introducing of the reactive gas plasma includes providing within the chamber either an oxidizing environment, or a reducing environment.

7. The method of claim 1 wherein the introducing of the reactive gas plasma includes providing within the chamber an environment containing either $O_2$, NO, $N_2O$, $H_2$ or $NH_3$.

8. The method of claim 1 wherein the introducing of the reactive gas plasma includes providing within the chamber an environment containing fluorine or a compound thereof.

9. The method of claim 1 further comprising:
   flowing the introduced reactive gas plasma at a rate of from 100 sccm to 50,000 sccm;
   maintaining pressure in the chamber at from 50 milliTorr to 650 Torr; and
   maintaining temperature of the wafer in the range of from 80 degrees C. to 900 degrees C.

10. The method of claim 1 further comprising:
    flowing the introduced reactive gas plasma at a rate of from 1,000 sccm to 10,000 sccm;
    maintaining pressure in the chamber at from 100 milliTorr to 10 Torr; and
    maintaining temperature of the wafer in the range of from 100 degrees C. to 600 degrees C.

* * * * *